(12) United States Patent
Schmitt et al.

(10) Patent No.: US 8,159,894 B2
(45) Date of Patent: Apr. 17, 2012

(54) ONE TIME PROGRAMMABLE MEMORY

(75) Inventors: Jonathan A. Schmitt, Eden Prairie, MN (US); Joseph Eugene Glenn, Eden Prairie, MN (US)

(73) Assignee: Broadcom Corporation, Irvine, CA (US)

( * ) Notice: Subject to any disclaimer, the term of this patent is extended or adjusted under 35 U.S.C. 154(b) by 460 days.

(21) Appl. No.: 12/003,216

(22) Filed: Dec. 20, 2007

(65) Prior Publication Data

US 2009/0059645 A1 Mar. 5, 2009

Related U.S. Application Data

(60) Provisional application No. 60/935,718, filed on Aug. 28, 2007.

(51) Int. Cl.
*G11C 17/18* (2006.01)

(52) U.S. Cl. ........................................ 365/225.7; 365/93
(58) Field of Classification Search .............. 365/225.7, 365/93
See application file for complete search history.

(56) References Cited

U.S. PATENT DOCUMENTS

| | | | |
|---|---|---|---|
| 7,327,629 B2 * | 2/2008 | Pan et al. .................... | 365/225.7 |
| 2007/0183181 A1 * | 8/2007 | Peng et al. ...................... | 365/96 |

* cited by examiner

*Primary Examiner* — Jason Lappas
(74) *Attorney, Agent, or Firm* — Sterne, Kessler, Goldstein & Fox P.L.L.C.

(57) ABSTRACT

A one-time programmable memory. The one-time programmable memory has an antifuse and a read circuit configured to read the antifuse. An isolation transistor couples the antifuse to the read circuit. The read circuit and the isolation transistor have different power domains.

20 Claims, 7 Drawing Sheets

ONE TIME PROGRAMMABLE MEMORY

CROSS REFERENCE TO RELATED APPLICATIONS

This application claims the benefit of U.S. Provisional Patent Application No. 60/935,718, filed Aug. 28, 2007, which is incorporated herein by reference in its entirety.

FIELD OF THE INVENTION

The present invention generally relates to information storage. More specifically, the present invention relates to non-volatile memory.

BACKGROUND

In the field of data storage, there are two general types of storage devices. The first type of storage device is volatile memory. Volatile memory loses stored information the instant power is removed from the volatile memory circuit. The second type of storage device is non-volatile memory. Non-volatile memory retains stored information even after power is removed from the non-volatile memory circuit. Some non-volatile memory designs permit reprogramming, while other designs only permit one-time programming. Thus, one form of non-volatile memory is a One-Time Programmable (OTP) memory.

An OTP memory may contain an antifuse. An antifuse is a device that continuously conducts after having been once subjected to a voltage in excess of a threshold voltage, also known as a programming voltage. In other words, an antifuse conducts only after it has been "blown." An antifuse may be formed from a conventional metal-oxide-semiconductor field-effect transistor (MOSFET).

There are several problems with a conventional OTP memory. The conventional OTP memory is expensive and has field failures due to unnecessary manufacturing defects caused by circuit complexity. Also, the conventional OTP memory is easily reprogrammed while being reverse engineered with a focused ion beam (FIB). The conventional OTP memory is not easily reduced from one process feature size to a smaller process feature size. Further, conventional read/write circuitry does not allow random access to an array of antifuses to determine status of a specific antifuse prior to programming of that antifuse.

An OTP memory should be as small as possible to maximize memory density. However, conventional OTP memory circuits are large, and thus do not maximize memory density. Further, the large size of conventional OTP memory circuits also causes them to be expensive. In addition, conventional OTP memory circuits tend to return unreliable validity test results because circuits that verify and determine an operating margin of the antifuse are separate from traditional read/write circuitry of the memory cell.

Thus, what is needed is an OTP memory that is capable of being randomly accessed prior to programming, is FIB attack-resistant, is less expensive, and that overcomes the other shortcomings described above.

BRIEF DESCRIPTION OF THE DRAWINGS/FIGURES

The accompanying drawings, which are incorporated herein and form a part of the specification, illustrate the embodiments and, together with the description, further serve to explain the principles of the embodiments and to enable a person skilled in the pertinent art to make and use the embodiments.

The embodiments are described with reference to the accompanying drawings. The drawing in which an element first appears is typically indicated by the leftmost digit(s) in the corresponding reference number.

DETAILED DESCRIPTION OF THE INVENTION

This specification discloses one or more embodiments that incorporate the features of this invention. The disclosed embodiment(s) merely exemplify the invention. The scope of the invention is not limited to the disclosed embodiment(s). The invention is defined by the claims.

The embodiment(s) described and references in the specification to "one embodiment," "an embodiment," "an example embodiment," etc., indicate that the embodiment(s) described may include a particular feature, structure, or characteristic. However, every embodiment may not necessarily include the particular feature, structure, or characteristic. Moreover, such phrases are not necessarily referring to the same embodiment. When a particular feature, structure, or characteristic is described in connection with an embodiment, it is understood that it is within the knowledge of one skilled in the art to effect such feature, structure, or characteristic in connection with other embodiments, whether or not explicitly described.

Conventional electronics, semiconductor manufacturing, memory technologies and other functional aspects of the devices (and components of the individual operating components of the devices) may not be described in detail herein for the sake of brevity. Furthermore, for purposes of brevity, the invention is described herein as pertaining to a memory for use in an electrical or electronic system. It should be appreciated that many other manufacturing techniques could be used to create the memory described herein, and that the techniques described herein could be used to fabricate individual devices, discrete circuits, memory arrays, or other devices. Further, the techniques would be suitable for application in electrical systems, optical systems, consumer electronics, industrial electronics, wireless systems, appliances, space applications, or any other application.

The terms antifuse, bit cell, and one time programmable (OTP) memory are used interchangeably in this field. The terms storage or programmable when coupled with the terms cell, element, memory or device are used interchangeably in this field. The terms chip, integrated circuit, monolithic device, semiconductor device and microelectronic device are also used interchangeably in this field. Arrays of memories may also be formed by connecting multiple antifuses in appropriate ways and with appropriate devices.

As used herein, the terms "logic bit," "logic signal," and "bit" are used interchangeably to refer to the same signal. Also, the terms "high-level bit," "logic '1'," "high signal," and "logic-one" are interchangeable. The terms "low-level bit," logic '0'," and "logic-zero" are interchangeable.

Figure 1A:
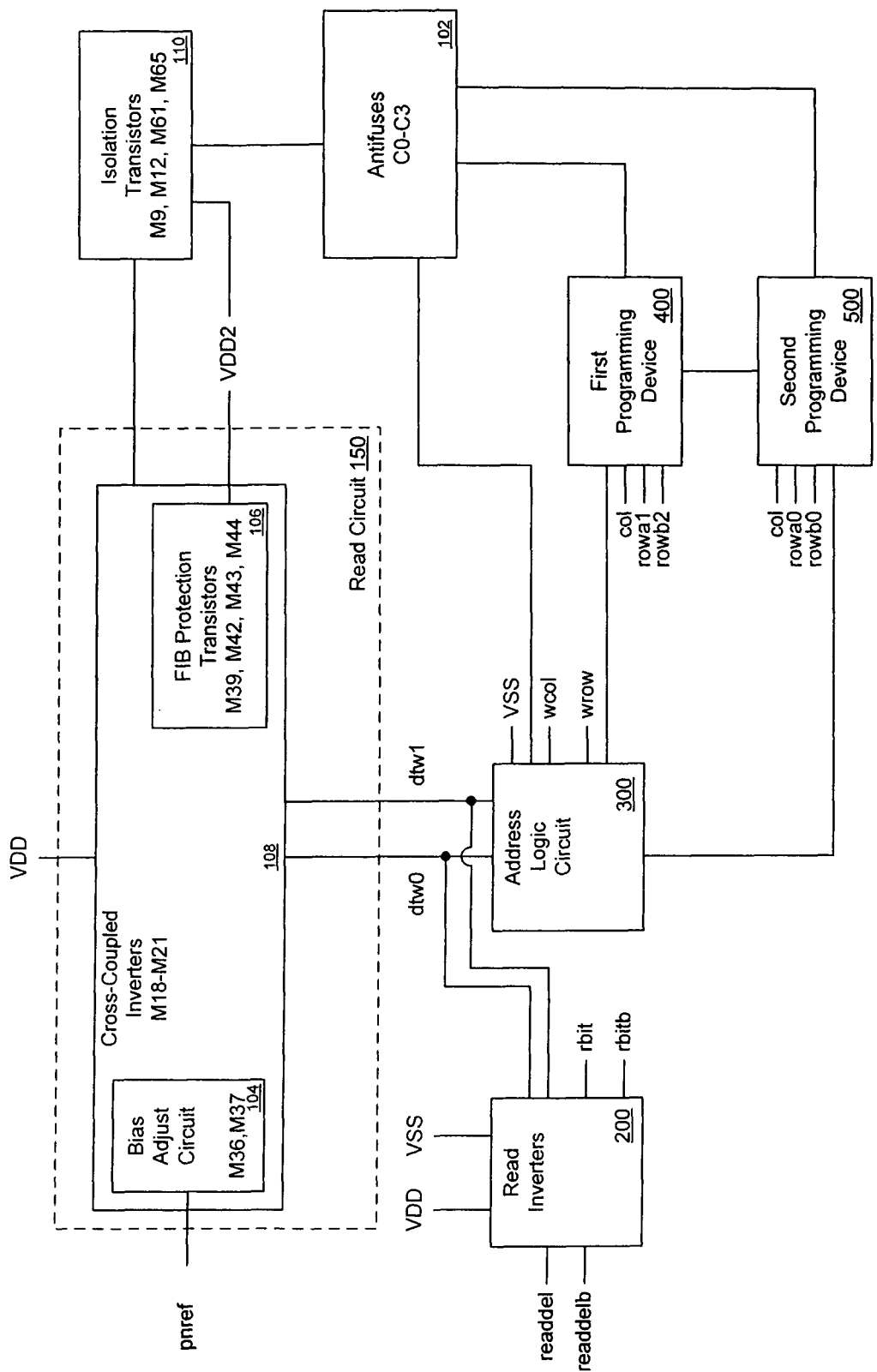
FIG. 1A illustrates an exemplary one time programmable memory.
Figure 3:
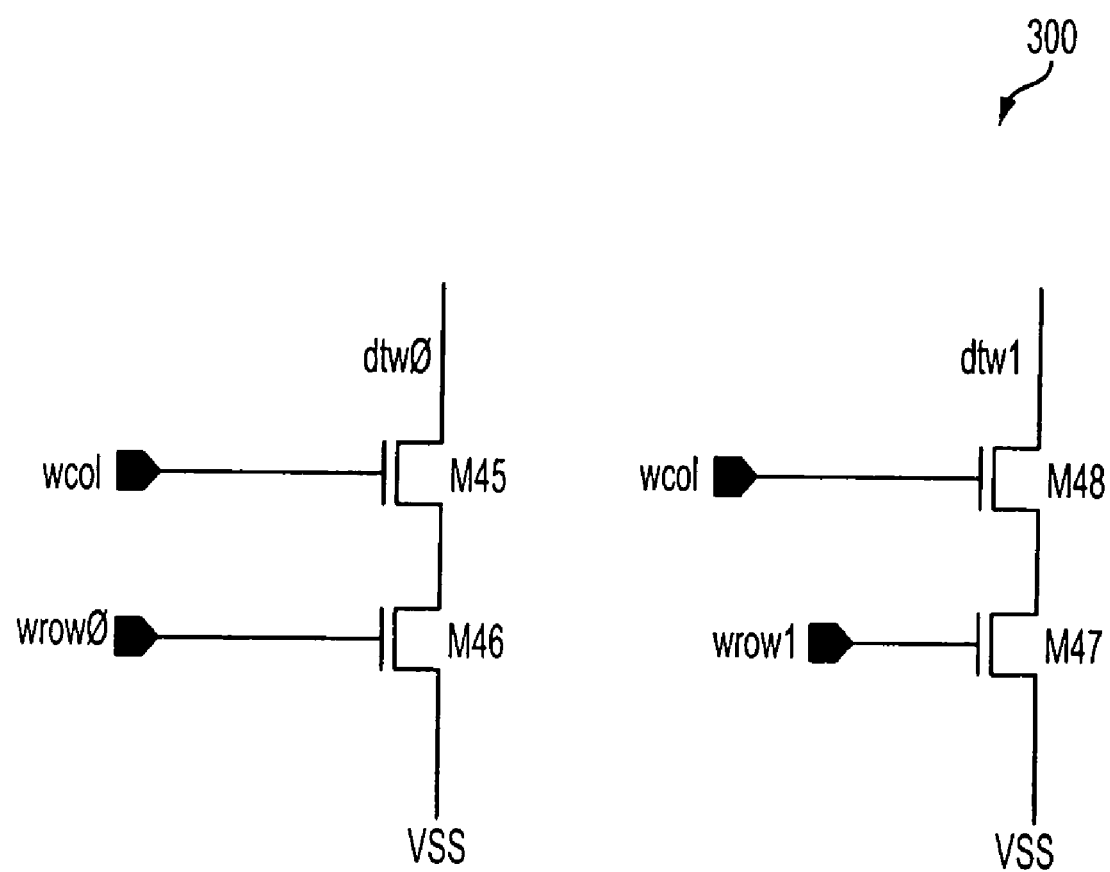
FIG. 3 illustrates an exemplary write circuit.
Figure 4:
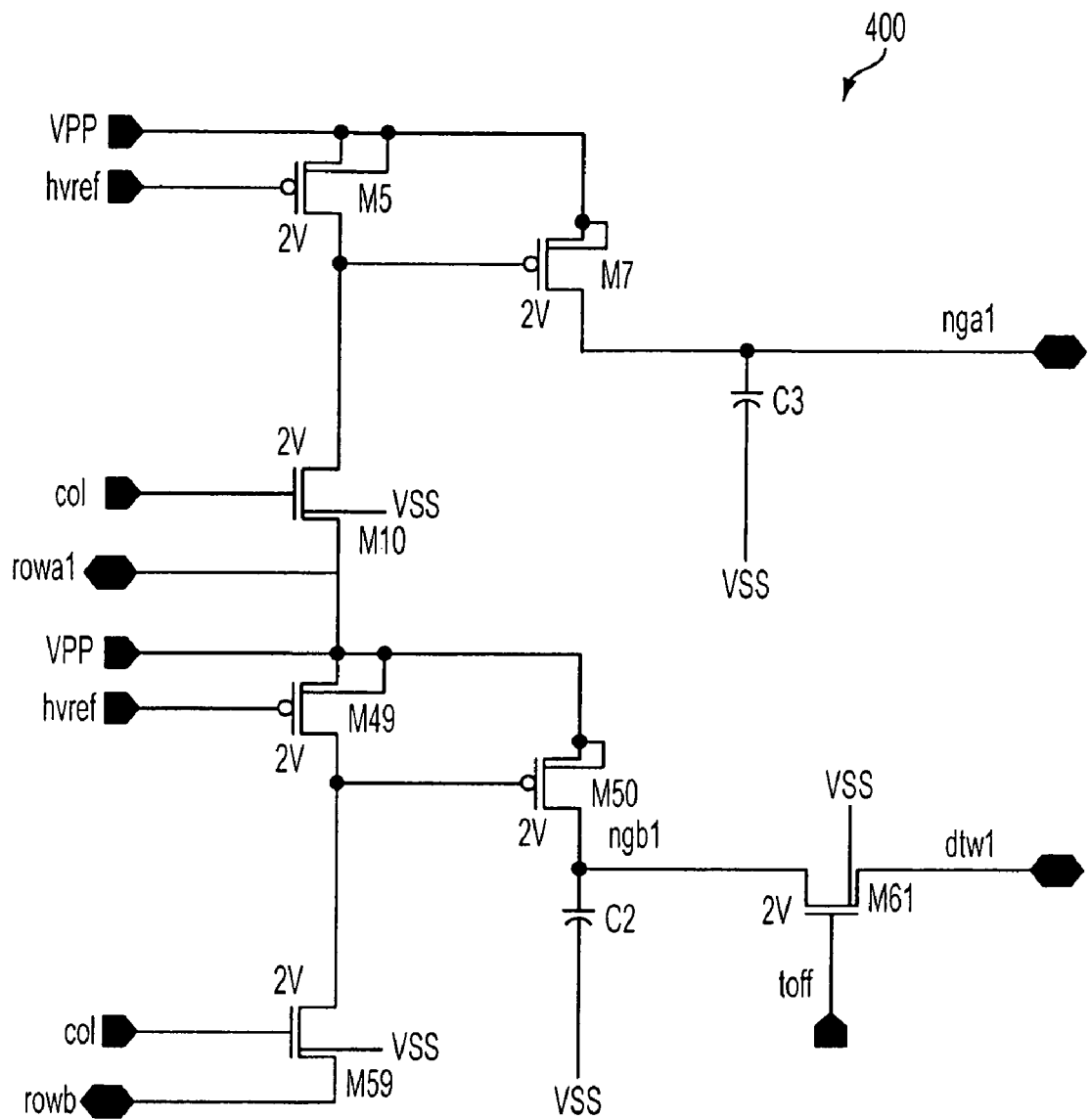
FIG. 4 illustrates a first set of exemplary programming devices and antifuses.
Figure 5:
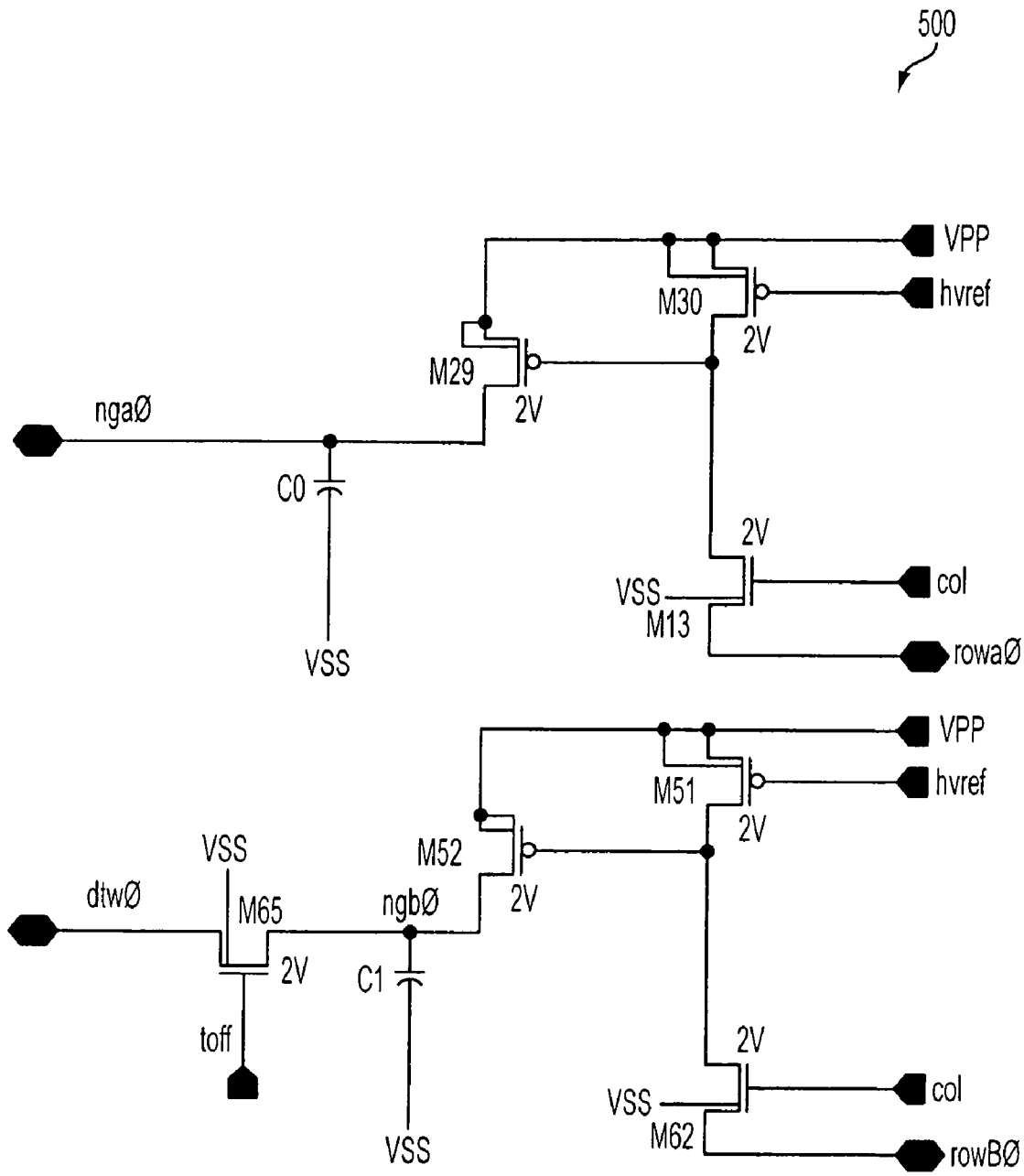
FIG. 5 illustrates a second set of exemplary programming devices and antifuses.

FIGS. 1A-5 illustrate an exemplary one time programmable (OTP) memory 100 (FIG. 1A), also known as a bit cell. In an example illustrated in FIG. 1A, the exemplary OTP memory 100 has a read circuit 150, antifuses 102 (FIG. 1B), read inverters 200 (FIG. 2), a write circuit 300 (FIG. 3), and a first and second set of exemplary programming devices 400 (FIG. 4), 500 (FIG. 5). FIG. 1A also illustrates that the OTP memory 100 also has a bias adjust circuit 104, focused ion beam (FIB) protection transistors 106, and cross-coupled inverters 108 as well isolation transistors 110.

The OTP memory 100 provides random access to evaluate a state of each antifuse C0-C3 both prior to and after programming. An isolation transistor having a power domain different from that of the read circuit 150 thwarts FIB attacks on the antifuses C0-C3. Further, the read circuit 150 has bias adjust transistors M36, M37 to margin antifuse resistance levels, prescreen the antifuses C0-C3 and increase static stability of the OTP memory 100 by setting a fiduciary level upon which a state of the antifuses C0-C3 is compared.

Figure 1B:
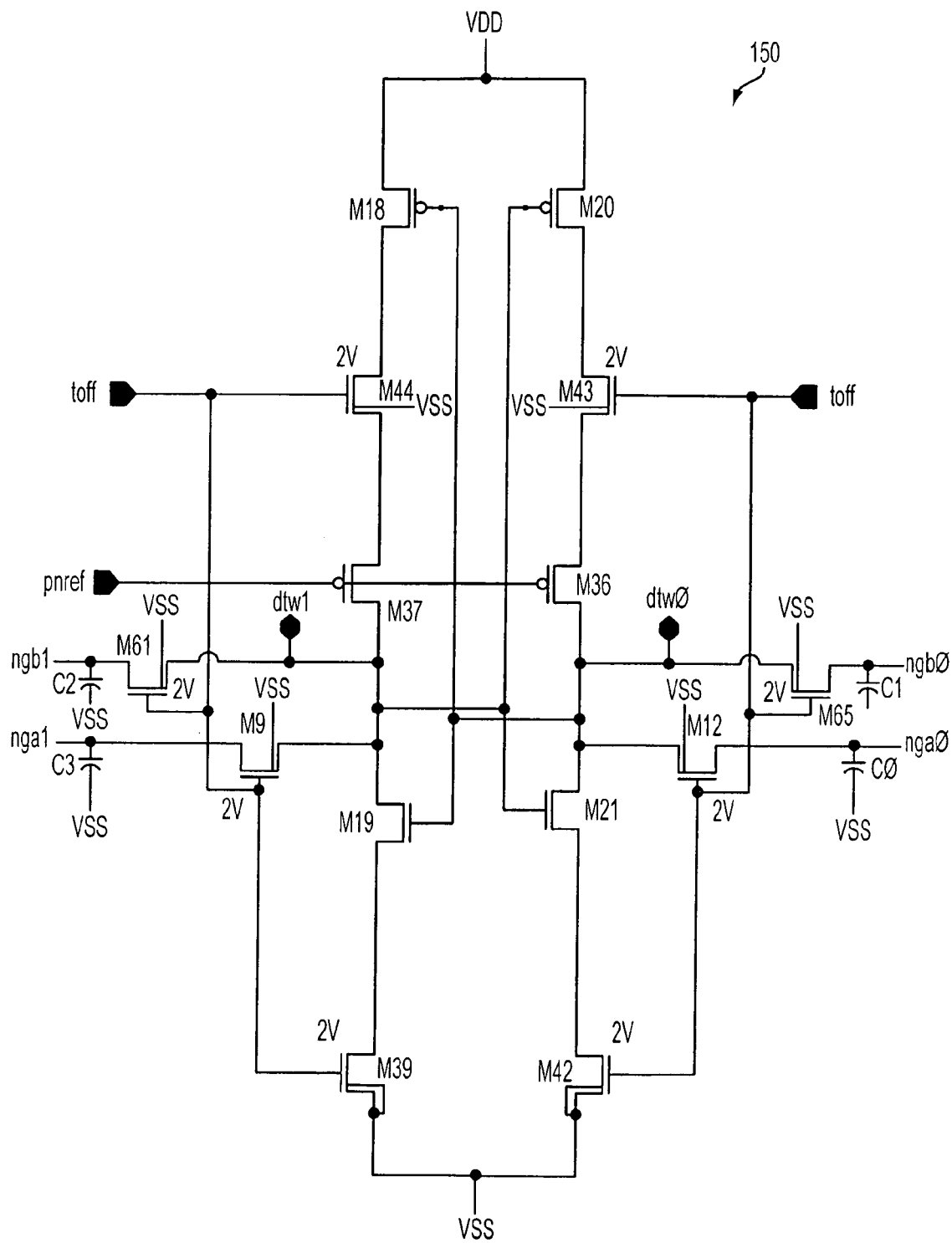
FIG. 1B illustrates an exemplary read circuit in a one time programmable memory.

FIG. 1B illustrates the exemplary read circuit 150 in the OTP memory 100. The read circuit 150 contains a pair of cross-coupled inverters formed by transistors M18, M19, M20, M21 and bit cell bias adjust transistors M36, M37. Fuse pass transistors M9, M12, M61, M65, also known as isolation transistors are coupled to the pair of cross-coupled inverters and are configured to read the antifuses C0-C3.

The antifuses C0-C3 are devices that may be shorted to ground in a destructive manner by a high voltage during programming. Prior to programming, the antifuses C0-C3 appear as an open to ground. After programming, the antifuses C0-C3 that are programmed appear as a low resistive path to ground. Once programmed, the antifuses C0-C3 set a state for the pair of cross-coupled inverters M18-M21, regardless of how the antifuses C0-C3 are written. The antifuses C0-C3 also set the state of the OTP memory 100 during power up.

The antifuses C2 and C3 are redundant with each other. The antifuses C0 and C1 are also redundant with each other. A redundancy feature may include more than two fuses. More than Antifuse redundancy can be used to increase a program yield and decreases a number of field failures of the OTP memory 100. This redundancy is not required.

Figure 2:
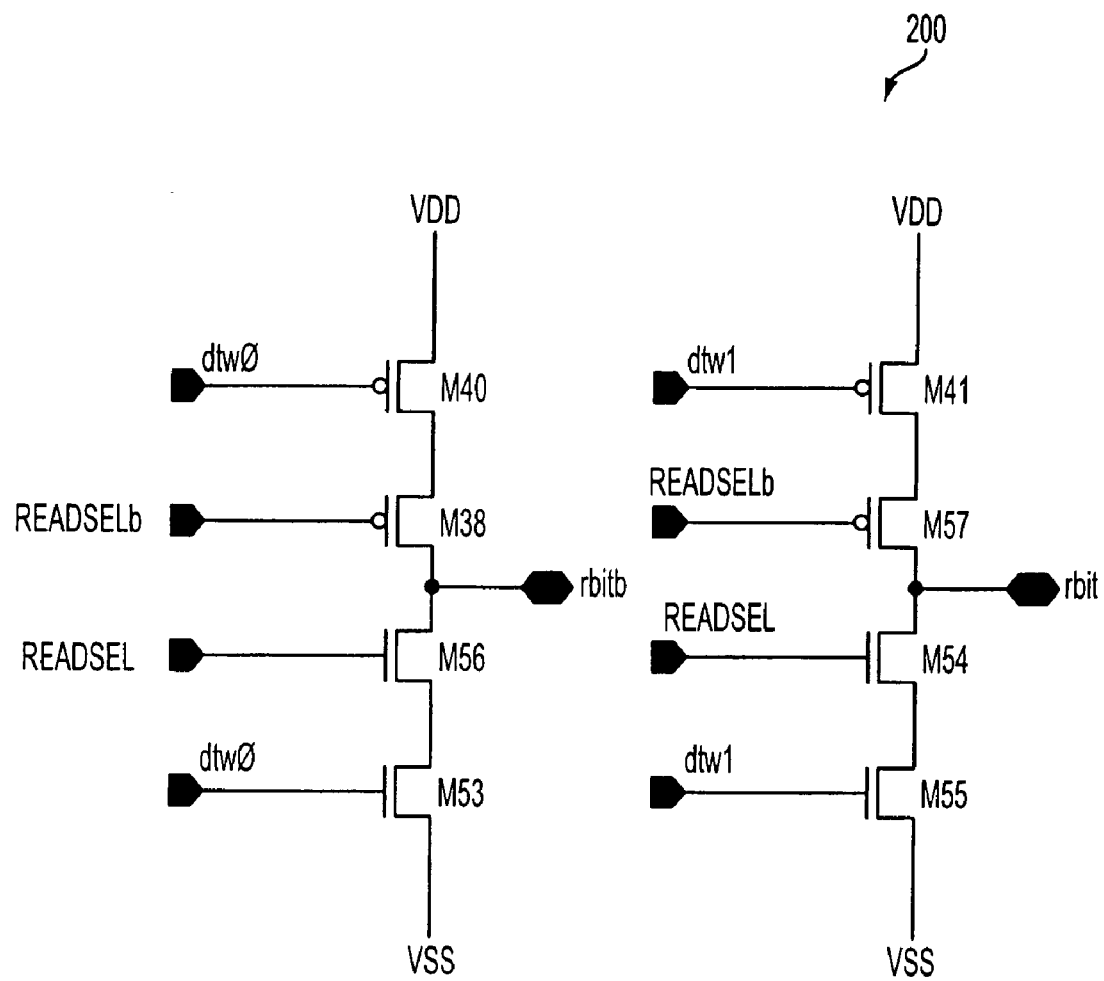
FIG. 2 illustrates exemplary read inverters.

The pair of cross-coupled inverters formed by transistors M18-M21 read the antifuses C0-C3. The inputs to the pair of cross-coupled inverters M18-M21 from the antifuses C0-C3 are identified in FIG. 1B as a first down to write node (dtw0) and a second down to write node (dtw1). The pair of cross-coupled inverters M18-M21 determines the state of the antifuses C0-C3 as a logic one or a logic zero. The pair of cross-coupled inverters M18-M21 outputs a signal to the read inverters 200 that are illustrated in FIG. 2 and described below. The output node of the pair of cross-coupled inverters M18-M21 is the second down to write node (dtw1). If the second down to write node (dtw1) is at VDD, the antifuses C0-C3 store a logic zero. If the second down to write node (dtw1) is at VSS, the antifuses C0-C3 store a logic one.

The bit cell bias adjust transistors M36, M37 in the exemplary read circuit 150 control a resistance level at which the antifuses C0-C3 should be programmed for the OTP memory 100 to be able to overwrite data in the antifuses C0-C3. The bit cell bias adjust transistors M36, M37 also determine an operating margin for antifuse resistance levels, prescreen the antifuses C0-C3, and increase static stability of the OTP memory 100 by setting a fiduciary level against which a state of the antifuse C0-C3 is compared. A transistor reference node (pnref) controls the bit cell bias adjust transistors M36, M37. Changing a voltage at the transistor reference node (pnref) input margins a quality of programmed antifuse resistance for different voltage and temperature environments and provides margin for a life of the OTP memory 100. In addition, the bit cell bias adjust transistors M36, M37 may prescreen the OTP memory 100, such as during post-manufacturing testing. By raising the voltage at the transistor reference node (pnref) input, a quality of the unprogrammed antifuses C0-C3 may be tested. The voltage level at the transistor reference node (pnref) input may also be lowered during a static state to increase a static stability of the OTP memory 100.

The fuse pass transistors M9, M12, M61, M65, also known as isolation transistors, protect the pair of cross-coupled inverters M18-M21 during programming of the antifuses C0-C3. Additionally, the fuse pass transistors M9, M12, M61, M65 allow the antifuses C0-C3 to be read during all other times when the OTP memory 100 is powered. The fuse pass transistors M9, M12, M61, M65 must be enabled for the read and write circuits to function.

The read circuit 150 has multiple power domains, a first power domain (VDD), and a second power domain (VDD2). Multiple power domains keep a hacker from taking control of the second power domain power supply (VDD2) and writing data to the OTP memory 100 independent of prior antifuse programming with only the first power domain power supply (VDD). The FIB protection transistors M39, M42, M43, M44 are included in the read circuit 150 because the fuse pass transistors M9, M12, M61, M65 are driven to a different voltage level (VDD2) than the voltage level (VDD) of the pair of cross-coupled inverters M18-M21.

In an example, the fuse pass transistors M9, M12, M61, M65, the FIB protection transistors M39, M42, M43, M44, the first set of programming devices 400, and the second set of programming devices 500 have the first power domain (VDD). The second power domain (VDD2) has a transistor off node (toff) that is not a part of the first power domain (VDD) to keep a hacker from taking control of the second power domain power supply (VDD2) and writing data to the OTP memory 100 independent of prior antifuse programming. In FIGS. 1B-5, the exemplary second power domain (VDD2) is illustrated as substantially two volts. However, VDD2 need not be limited to two volts and may be designed to function at any voltage.

FIG. 2 illustrates a pair of exemplary read inverters 200 that are coupled to an output of the read circuit 100. Inputs to the pair of read inverters 200 are signals from the cross-coupled inverter M18-M21 on the second down to write node (dtw1) and the first down to write node (dtw0). A first read select node (readsel) and a second read select node, (readselb) are also inputs to the pair of read inverters 200. The pair of read inverters 200 forward the signal from the second down to write node (dtw1) and the first down to write node (dtw0) to respective first read bit output bus (rbit) and second read bit output bus (rbitb) when the first read select node (readsel) and the second read select node (readselb) is active.

FIG. 3 illustrates the write circuit 300. The write circuit 300 includes row address transistors M46, M47 and column address transistors M45, M48. The write circuit 300 is coupled to the read inverters 200 via the first down to write node (dtw0) and second down to write node (dtw1), and is used to write a logic one to either side of the cross-coupled inverters M18-M21 prior to programming of the antifuses C0-C3. When data is to be written into the cell, one side of the cross-coupled inverters M18-M21 is pulled low. After an antifuse is programmed, the programming of the antifuse overrides the output of the write circuit 300.

The write circuit 300 is also coupled to the programming devices 400, 500 described in FIGS. 4 and 5 to enable and disable the programming devices 400, 500 that are coupled to the antifuses C0-C3. The write circuit 300 decodes signals present on an input write column node (wcol), an input first write row node (wrow0), and an input second write row node (wrow1) to select transistors M45, M46, M47, M48 during the programming process. When data is to be written into the antifuses C0-C3, one side of the pair of cross-coupled inverters M18-M21 is pulled low, and the pair of cross-coupled inverters M18-M21 switches to a state of the data to be written. When an unprogrammed antifuse is to be read, the write circuit 300 disables the programming devices 400, 500 to prevent accidental programming of the antifuses C0-C3.

FIGS. 4 and 5 illustrate the first set of programming devices 400, the second set of exemplary programming devices, 500, and the antifuses C0-C3. The first set of programming devices 400 includes transistors M5, M7, M10, M49, M50, and M59 and is coupled to antifuses C2 and C3. The second set of programming devices 500 includes transistors M30, M29, M13, M51, M52, and M62 and is coupled to antifuses C0 and C1.

Prior to programming, the antifuses C0-C3 are open circuits. To program a data bit into the antifuse, the programming devices 400, 500 provide a voltage across the antifuse C0-C3. The voltage may be either zero volts or a programming voltage in excess of a critical electric field of the antifuse. The specific antifuse C0-C3 to be programmed is determined by signals on a first row address node (rowa0), a second row address node (rowa1), a third row address node (rowb0), a fourth row address node (rowb1), and a column signal (col) input to the first and second set of programming devices 400, 500. The signals on a first row address node (rowa0), the second row address node (rowa1), the third row address node (rowb0), and the fourth row address node (rowb1) also determine the logic state to which the associated antifuse is programmed. If the first or second respective programming device 400, 500 applies a zero voltage across an antifuse, the respective programming device 400, 500 programs a logic one by leaving the antifuse unruptured. If the respective programming device 400, 500 applies a voltage in excess of the critical electric field across the antifuse to rupture the antifuse, the respective programming devices 400, 500 programs a logic zero. Both the first and second respective programming device 400, 500 may be used simultaneously.

After programming, the antifuse that is programmed does not allow current flow if a logic one is programmed. Conversely, if a logic zero is programmed, the antifuse does allow current flow. The antifuses C0-C3 are read by the read circuit 150 with an applied voltage less that of the critical electric field so that the process of reading does not inadvertently program the antifuses C0-C3. Thus, reading the antifuses C0-C3 does not change previous programming of the antifuses C0-C3. The antifuse C0-C3 retains the programmed state at power-up and after programming. After programming, the antifuses C0-C3 indicate the state in which they are programmed and may only be read as that state for the rest of life of the OTP memory 100, with one exception. An unruptured antifuse may always be ruptured during subsequent programming. However, a ruptured antifuse may not be unruptured.

In order to achieve a high density memory or other memory circuit with multiple OTP memories, such as a redundant memory or a memory having error correction, the OTP memory 100 should be as small as possible. Therefore, in an example, at least a part of a circuit described herein is deposited on a substrate, such as a substrate in an integrated circuit.

The OTP memory 100 may be manufactured with process feature sizes such as about 130 nm and about 65 nm, as well as other process feature sizes including process feature sizes smaller than about 130 nm. The devices described herein may be manufactured with a CMOS logic manufacturing process.

Figure 6:
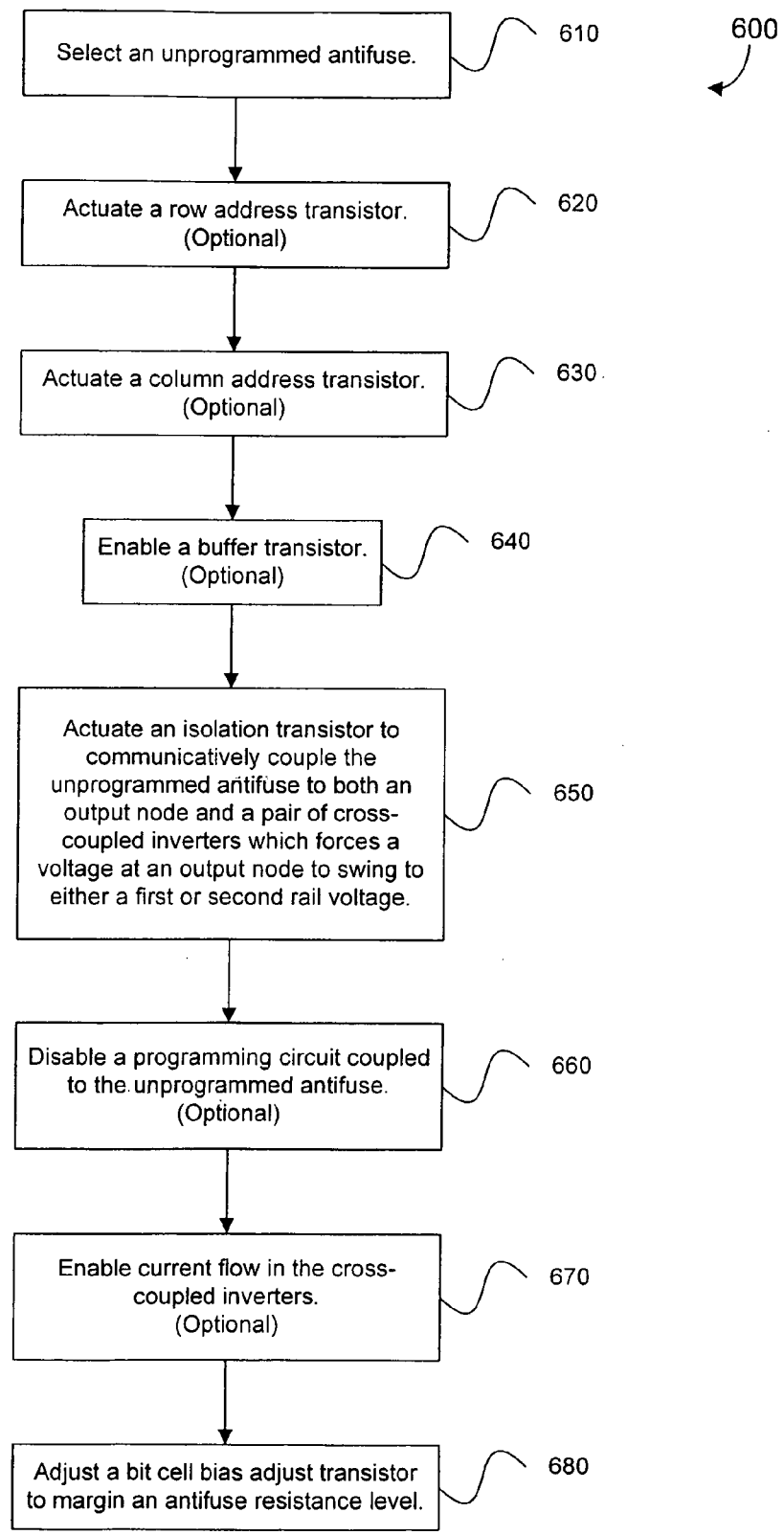
FIG. 6 illustrates a method for reading an unprogrammed antifuse.

FIG. 6 illustrates a method for reading an unprogrammed antifuse 600. In step 610, an unprogrammed antifuse is selected. The method 600 may also include step 620, in which a row address transistor is actuated to select the unprogrammed antifuse from a plurality of antifuses. Further, the method 600 may also include step 630, in which a column address transistor is actuated to select the unprogrammed antifuse from a plurality of antifuses. In optional step 640, a buffer transistor is enabled. The buffer transistor may buffer an output of the unprogrammed antifuse from a circuit external to the unprogrammed antifuse.

In a step 650, an isolation transistor is actuated to communicatively couple the unprogrammed antifuse to both an output node and a pair of cross-coupled inverters, which force a voltage at the output node to swing to either a first or second rail voltage. In optional step 660, a programming circuit coupled to the unprogrammed antifuse is disabled. In an example, the step 660 isolates the programming circuit from a read circuit to prevent the programming circuit from damaging the read circuit. In optional step 670, current flow in the cross-coupled inverters is enabled. In a step 680, a bit cell bias adjust transistor is adjusted to margin an antifuse resistance level. Margining the antifuse resistance level determines a resistance level of the unprogrammed antifuse and may provide information to determine if the antifuse is defective.

CONCLUSION

Example embodiments of the methods, systems, and components of the present invention are described herein. As noted elsewhere, these example embodiments are described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention are not limited by any of the above-described exemplary embodiments, but are defined only in accordance with the following claims and their equivalents.

What is claimed is:

1. A one-time programmable memory, comprising:
   an antifuse;
   a read circuit configured to read said antifuse; and
   an isolation transistor coupled between said antifuse and said read circuit,
   wherein said read circuit and said isolation transistor are coupled to a first power domain and a second power domain respectively, the first power domain and the second power domain being independent of each other such that power from one of the first and second power domains is not derived from the other power domain.

2. The one-time programmable memory of claim 1, wherein at least a part of the one-time programmable memory is deposited on a substrate.

3. The one-time programmable memory of claim 1, further comprising:
   a second isolation transistor; and
   a second antifuse coupled to said read circuit via said second isolation transistor,
   wherein said second antifuse is coupled in parallel with said first antifuse, and further wherein said read circuit and said second isolation transistor are coupled to the first power domain and a third power domain respectively, the first power domain and the third power domain being independent of each other such that power from one of the first and third power domains is not derived from the other power domain.

4. The one-time programmable memory of claim 3, wherein said isolation transistor and said second isolation transistor have an identical power domain.

5. The one-time programmable memory of claim 1, wherein said read circuit comprises a pair of cross-coupled inverters coupled to said antifuse.

6. The one-time programmable memory of claim 5, further comprising a second isolation transistor coupled to said cross-coupled inverters to disable said cross-coupled inverters, wherein said read circuit and said second isolation transistor are coupled to the first power domain and a third power domain respectively, the first power domain and the third power domain being independent of each other such that power from one of the first and third power domains is not derived from the other power domain.

7. The one-time programmable memory of claim 1, further comprising a write circuit coupled to write a logic one to said read circuit prior to programming said antifuse.

8. A one-time programmable memory, comprising:
an antifuse; and
a read circuit configured to read said antifuse and having a bias adjust transistor connected between a pair of cross-coupled inverters,
wherein said bias adjust transistor sets a minimum readable antifuse resistance of said read circuit.

9. The one-time programmable memory of claim 8, wherein at least a part of said one-time programmable memory is deposited on a substrate.

10. The one-time programmable memory of claim 8, further comprising an isolation transistor coupled between said antifuse and said read circuit, wherein said read circuit and said isolation transistor are coupled to a first power domain and a second power domain respectively, the first power domain and the second power domain being independent of each other such that power from one of the first and second power domains is not derived from the other power domain.

11. The one-time programmable memory of claim 8, wherein said read circuit comprises a pair of cross-coupled inverters coupled to said antifuse.

12. The one-time programmable memory of claim 11, further comprising an isolation transistor coupled to said cross-coupled inverters to disable said cross-coupled inverters, wherein said read circuit and said isolation transistor are coupled to a first power domain and a second power domain respectively, the first power domain and the second power domain being independent of each other such that power from one of the first and second power domains is not derived from the other power domain.

13. The one-time programmable memory of claim 8, further comprising a write circuit coupled to write a logic one to said read circuit prior to programming said antifuse.

14. A method for reading an unprogrammed antifuse, comprising:
selecting the unprogrammed antifuse; and
actuating an isolation transistor to communicatively couple the unprogrammed antifuse to both an output node and a pair of cross-coupled inverters which forces a voltage at said output node to swing to either a first or second rail voltage, wherein the isolation transistor and a read circuit are coupled to a first power domain and a second power domain respectively, the first power domain and the second power domain being independent of each other such that power from one of the first and second power domains is not derived from the other power domain.

15. The method of claim 14 wherein said selecting further comprises actuating a row address transistor.

16. The method of claim 14, wherein said selecting further comprises actuating a column address transistor.

17. The method of claim 14, wherein said selecting enables a buffer transistor.

18. The method of claim 14, wherein said actuating disables a programming circuit coupled to the unprogrammed antifuse.

19. The method of claim 14, wherein said actuating allows for current flow in said cross-coupled inverters.

20. The method of claim 12, further comprising adjusting a bit cell bias adjust transistor to margin an antifuse resistance level.

* * * * *